(12) United States Patent
Schicktanz et al.

(10) Patent No.: US 9,716,247 B2
(45) Date of Patent: Jul. 25, 2017

(54) OPTOELECTRONIC COMPONENT INCLUDING EXPOSED CONTACT PAD

(71) Applicant: OSRAM OPTO SEMICONDUCTORS GMBH, Regensburg (DE)

(72) Inventors: Simon Schicktanz, Regensburg (DE); Philipp Schwamb, Regensburg (DE); Evelyn Trummer-Sailer, Mintraching (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/430,954

(22) PCT Filed: Sep. 25, 2013

(86) PCT No.: PCT/EP2013/069939
§ 371 (c)(1),
(2) Date: Mar. 25, 2015

(87) PCT Pub. No.: WO2014/048971
PCT Pub. Date: Apr. 3, 2014

(65) Prior Publication Data
US 2015/0228923 A1 Aug. 13, 2015

(30) Foreign Application Priority Data
Sep. 27, 2012 (DE) .......... 10 2012 109 140

(51) Int. Cl.
*H01L 29/08* (2006.01)
*H01L 35/24* (2006.01)
(Continued)

(52) U.S. Cl.
CPC ........ *H01L 51/5246* (2013.01); *H01L 51/448* (2013.01); *H01L 51/56* (2013.01)

(58) Field of Classification Search
CPC .... H01L 51/448; H01L 51/5246; H01L 51/56
(Continued)

(56) References Cited

U.S. PATENT DOCUMENTS

| 7,300,500 B2 | 11/2007 | Okada et al. |
| 7,622,199 B2 | 11/2009 | Tanaka et al. |

(Continued)

FOREIGN PATENT DOCUMENTS

| CN | 102210035 A | 10/2011 |
| CN | 102361064 A | 2/2012 |

(Continued)

OTHER PUBLICATIONS

German Search Report based on Application No. 10 2012 109 140.4(5 Pages) dated Aug. 9, 2013 (Reference Purpose Only).
(Continued)

*Primary Examiner* — Matthew Gordon
(74) *Attorney, Agent, or Firm* — Viering, Jentschura & Partner mbB

(57) ABSTRACT

Various embodiments may relate to an optoelectronic component, including a carrier, a planar, electrically active region on or above the carrier; an adhesion layer on or above the electrically active region, wherein the adhesion layer at least partly surrounds the electrically active region, a cover on or above the adhesion layer, wherein a part of the adhesion layer is exposed, and an encapsulation on or above the exposed adhesion layer, wherein the encapsulation is formed from an inorganic substance or substance mixture. Further various embodiments may relate to a method for producing an optoelectronic component.

18 Claims, 7 Drawing Sheets

(51) Int. Cl.
*H01L 51/00* (2006.01)
*H01L 51/52* (2006.01)
*H01L 51/44* (2006.01)
*H01L 51/56* (2006.01)

(58) Field of Classification Search
USPC .................................................... 257/40
See application file for complete search history.

(56) References Cited

U.S. PATENT DOCUMENTS

| | | | |
|---|---|---|---|
| 2009/0200924 A1 | 8/2009 | Matsuzaki et al. | |
| 2010/0167002 A1* | 7/2010 | Chu | H01L 51/5237 428/69 |
| 2012/0181914 A1 | 7/2012 | Fukuda et al. | |
| 2013/0003206 A1* | 1/2013 | Kabagambe | C03C 17/38 359/883 |

FOREIGN PATENT DOCUMENTS

| | | | | |
|---|---|---|---|---|
| JP | 2009117178 A | | 5/2009 | |
| JP | 2010004041 A | | 1/2010 | |
| KR | 1020110070388 | * | 6/2011 | ............ H01L 51/56 |
| KR | 20110089349 A | | 8/2011 | |
| WO | 0231882 A1 | | 4/2002 | |
| WO | 2010077412 A1 | | 7/2010 | |

OTHER PUBLICATIONS

Chinese Office Action based on Application No. 201380050885.X(8 Pages and 10 pages of English translation) dated Apr. 1, 2016 (Reference Purpose Only).
Korean Office Action based on Application No. 10-2015-7010968(5 Pages and 6 pages of English translation) dated Mar. 22, 2016 (Reference Purpose Only).
Korean Office Action based on application No. 10-2015-7010968 (3 pages and 3 pages of English translation) dated Oct. 31, 2016 (Reference Purpose Only).
Notice of Allowance received for corresponding Korean Application No. 10-2015-7010968, dated May 30 2017, 3 pages including 1 page of English translation.

* cited by examiner

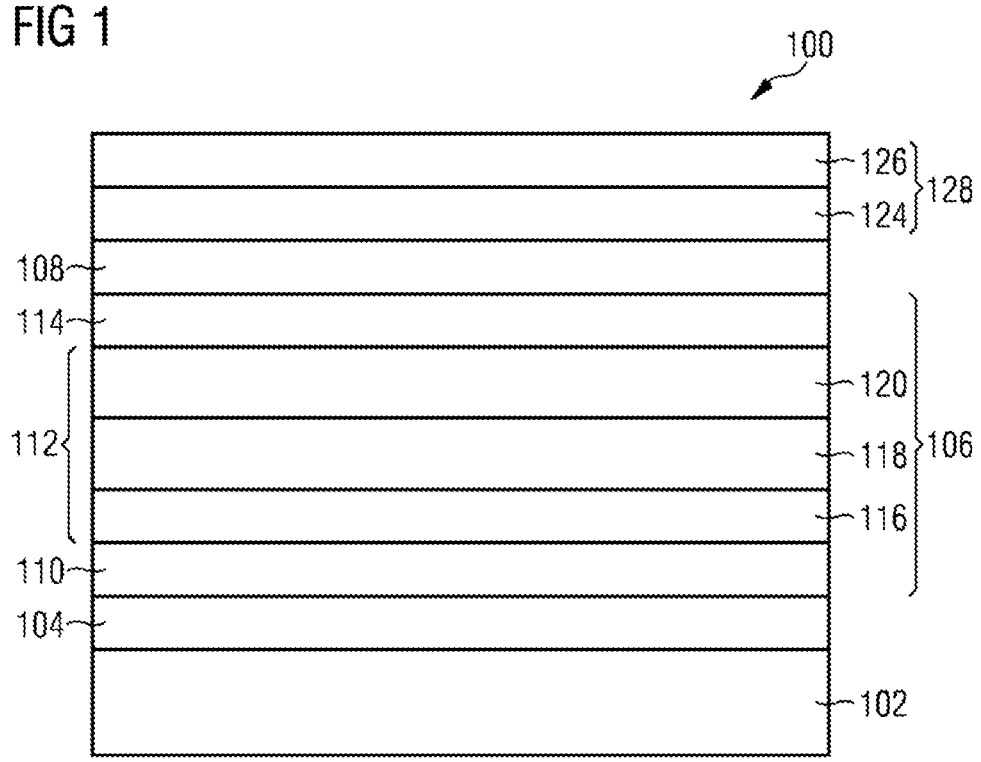

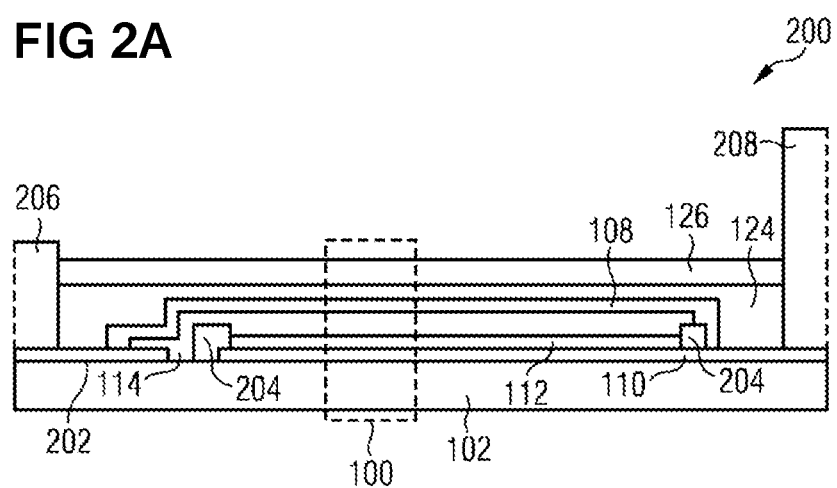
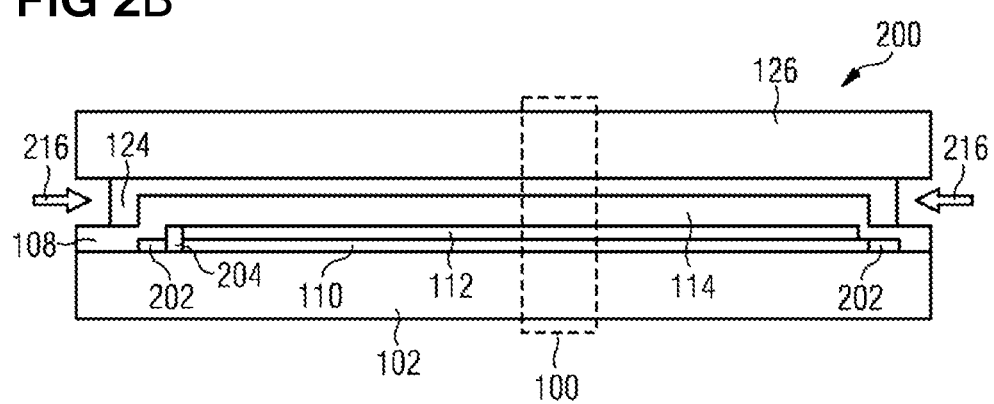

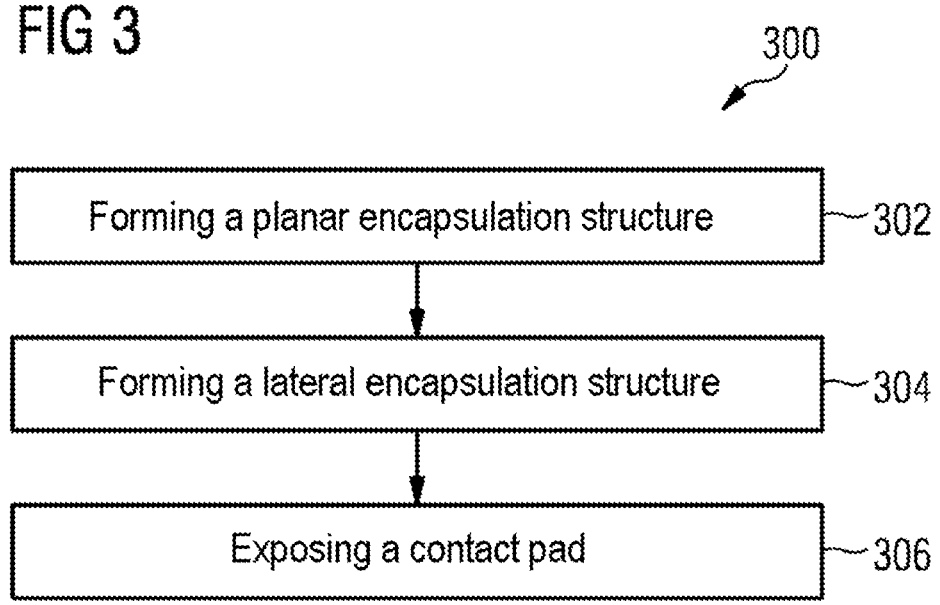

OPTOELECTRONIC COMPONENT INCLUDING EXPOSED CONTACT PAD

RELATED APPLICATIONS

The present application is a national stage entry according to 35 U.S.C. §371 of PCT application No.: PCT/EP2013/069939 filed on Sep. 25, 2013, which claims priority from German application No.: 10 2012 109 140.4 filed on Sep. 27, 2012, and is incorporated herein by reference in its entirety.

TECHNICAL FIELD

In various embodiments, an optoelectronic component and a method for producing an optoelectronic component are provided.

BACKGROUND

Optoelectronic components on an organic basis, for example an organic light emitting diodes (OLED) or an organic solar cell, are being increasingly widely used.

An OLED may include for example two electrodes, for example two contact metallization designed as an anode and a cathode, with an organic functional layer system therebetween. The organic functional layer system may include one or a plurality of emitter layer/s in which electromagnetic radiation is generated, for example, one or a plurality of charge generating layer structure each composed of two or more charge generating layers (CGL) for charge generation, and one or a plurality of electron blocking layers, also designated as hole transport layer(s) (HTL), and one or a plurality of hole blocking layers, also designated as electron transport layer(s) (ETL), in order to direct the current flow.

At least one part of the organic functional layer system may include organic substances and/or organic substance mixtures. However, organic substances and/or organic substance mixtures can be susceptible to harmful environmental influences. A harmful environmental influence can be understood to mean all influences which can potentially lead to degradation or aging, for example a crosslinked state or crystallization, of organic substances and/or organic substance mixtures and can thus limit the operating period of the OLED, for example. A harmful environmental influence can be for example a substance harmful to organic substances or organic substance mixtures, for example oxygen and/or water.

For protection against harmful environmental influences, an OLED is customarily encapsulated. During the encapsulation of an OLED, by way of example, the organic functional layer structure and the electrodes are surrounded with an encapsulation layer that is impermeable to harmful environmental influences, for example a thin film that is impermeable to water and oxygen.

The encapsulation layer for thin-film-encapsulated organic light emitting diodes should be absolutely free of defects. In the course of encapsulation, however, the situation in which defects are still located in the encapsulation layer cannot be completely ruled out. Even a microscopic defect or a diffusion channel along a grain boundary in said encapsulation layer can lead to a defect of the entire OLED. As a result, non-luminous, circular points (black spot) can form in the field of view of the OLED by the action of moisture and can grow over the course of time.

In order that the potential damage for an OLED is kept small, in one conventional method a glass cover is laminated onto the encapsulation layer by a laminating adhesive. However, only the rate at which water diffuses into the OLED, for example, can be reduced by the glass cover. Water can for example still diffuse into the organic functional layer structure through the laminating adhesive, such that for example a defect in the encapsulation layer of an OLED is merely slowed down as it leads to a visible defect.

In another conventional method, a cavity glass can be adhesively bonded to the OLED, wherein the adhesive bonding is effected in the geometrical edge of the OLED and a water-absorbent material is set up in the cavity.

In another conventional method, a glass cover can be applied to the encapsulation layer for example by frit bonding (glass frit bonding/glass soldering/seal glass bonding) by a conventional glass solder in the geometrical edge regions.

SUMMARY

In various embodiments, an optoelectronic component and a method for producing an optoelectronic component are provided which make it possible to reduce the diffusion of moisture into an optoelectronic component, for example into an OLED component, and thus to increase for example the storage time of the OLED.

In the context of this description, an organic substance can be understood to mean a carbon compound which, regardless of the respective state of matter, is present in chemically uniform form and is characterized by characteristic physical and chemical properties. Furthermore, in the context of this description, an inorganic substance can be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) can be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture can be understood to mean something which has constituents consisting of two or more different substances, the constituents of which are very finely dispersed, for example. A substance class should be understood to mean a substance or a substance mixture including one or more organic substance(s), one or more inorganic substance(s) or one or more hybrid substance(s). The term "material" can be used synonymously with the term "substance".

In the context of this description, a first substance or a first substance mixture can be identical to a second substance or a second substance mixture, respectively, if the chemical and physical properties of the first substance or first substance mixture are identical to the chemical and physical properties of the second substance or of the second substance mixture, respectively.

In the context of this description, a first substance or a first substance mixture can be similar to a second substance or a second substance mixture, respectively, if the first substance or the first substance mixture and the second substance or the second substance mixture, respectively, have an approximately identical stoichiometric composition, approximately identical chemical properties and/or approximately identical physical properties with regard to at least one variable, for example the density, the refractive index, the chemical resistance or the like.

In this respect, by way of example, with regard to the stoichiometric composition, crystalline $SiO_2$ (quartz) can be regarded as identical to amorphous $SiO_2$ (silica glass) and as similar to $SiO_x$. However, with regard to the refractive index, crystalline $SiO_2$ can be different than $SiO_x$ or amorphous $SiO_2$. By the addition of additives, for example in the form of dopings, by way of example, amorphous $SiO_2$ can have a refractive index which is identical or similar to that of crystalline $SiO_2$, but can then be different than crystalline $SiO_2$ with regard to the chemical composition and/or the chemical resistance.

The reference variable in terms of which a first substance is similar to a second substance can be indicated explicitly or become apparent from the context, for example from the common properties of a group of substances or substance mixtures.

A dimensionally stable substance can become plastically formable, i.e. can be liquefied, by the addition of plasticizers, for example solvent, or by the temperature being increased.

A plastically formable substance can become dimensionally stable, i.e. can be solidified, by a crosslinking reaction, withdrawal of plasticizers and/or heat.

Solidifying a substance or substance mixture, i.e. the transition of a substance from formable to dimensionally stable, may include changing the viscosity, for example increasing the viscosity from a first viscosity value to a second viscosity value. The second viscosity value can be greater than the first viscosity value by a multiple, for example in a range of approximately 10 to approximately $10^6$. The substance can be formable at the first viscosity and dimensionally stable at the second viscosity.

Solidifying a substance or substance mixture, i.e. the transition of a substance from formable to dimensionally stable, may include a method or a process in which low molecular weight constituents are removed from the substance or substance mixture, for example solvent molecules or low molecular weight, uncrosslinked constituents of the substance or of the substance mixture, for example drying or chemically crosslinking the substance or the substance mixture. The substance or the substance mixture can have for example, in the formable state a higher concentration of low molecular weight substances in the overall substance or substance mixture than in the dimensionally stable state.

A body composed of a dimensionally stable substance or substance mixture can be formable, however, for example if the body is designed as a film, for example a plastics film, a glass film or a metal film. Such a body can be referred to as mechanically flexible, for example, since changes in the geometrical shape of the body, for example bending of a film, can be reversible. A mechanically flexible body, for example a film, can also be plastically formable, however, for example by the mechanically flexible body being solidified after the deformation, for example thermoforming of a plastics film.

The connection of a first body to a second body can be positively locking, force locking and/or cohesive. The connections can be embodied as releasable, i.e. reversible. In various configurations, a reversible, cohesive connection can be realized for example as a screw connection, a hook and loop fastener, a clamping/a use of clips.

However, the connections can also be embodied as non-releasable, i.e. irreversible. In this case, a non-releasable connection can be separated only by the connection means being destroyed. In various configurations, an irreversible, cohesive connection can be realized for example as a riveted connection, an adhesively bonded connection or a soldered connection.

In the case of a positively locking connection, the movement of the first body can be restricted by a surface of the second body, wherein the first body moves perpendicularly, i.e. normally, in the direction of the restricting surface of the second body. A pin (first body) in a blind hole (second body) can be restricted in movement for example in five of the six spatial directions. In various configurations, a positively locking connection can be realized for example as a screw connection, a hook and loop fastener, a clamp/a use of clips.

In the case of a force-locking connection, on account of a physical contact of the two bodies under pressure, a static friction can restrict a movement of the first body parallel to the second body. One example of a force-locking connection may be, for example, a bottle cork in a bottle neck or a dowel with an interference fit in a corresponding dowel hole. Furthermore, the force-locking connection can be formed by a press fit between a first body and a second body. By way of example, a diameter of the holding pin can be chosen such that it can still just be inserted into the holding cutout with deformation of the holding pin and/or of the corresponding holding cutout, but can be removed again from the latter only with increased expenditure of force.

In the case of a cohesive connection, the first body can be connected to the second body by atomic and/or molecular forces. Cohesive connections can often be non-releasable connections. In various configurations, a cohesive connection can be realized for example as an adhesively bonded connection, a soldered connection, for example of a glass solder, or of a metal solder, a welded connection.

In the context of this description, an electronic component can be understood to mean a component which concerns the control, regulation or amplification of an electric current, for example by the use of semiconductor components. An electronic component may include a component from the group of the following components: for example a diode, a transistor, a thermogenerator, an integrated circuits, a thyristor.

In the context of this description, an electronic component with which electrical contact is made can be understood as an embodiment of an electrical component.

In the context of this description, an optoelectronic component can be understood to mean an embodiment of an electronic component, wherein the optoelectronic component includes an optically active region.

In the context of this description, an optically active region of an optoelectronic component can be understood to mean that region of an optoelectronic component which can absorb electromagnetic radiation and form a photocurrent therefrom or can emit electromagnetic radiation by a voltage applied to the optically active region.

In the context of this description, providing electromagnetic radiation can be understood to mean emitting electromagnetic radiation.

In the context of this description, taking up electromagnetic radiation can be understood to mean absorbing electromagnetic radiation.

An optoelectronic component including two planar, optically active sides can be embodied for example as transparent, for example as a transparent organic light emitting diode.

However, the optically active region can also include one planar, optically active side and one planar, optically inactive side, for example an organic light emitting diode designed as a top emitter or bottom emitter.

In various configurations, a component which emits electromagnetic radiation can be for example a semiconductor component which emits electromagnetic radiation, and/or can be embodied as a diode which emits electromagnetic radiation, as an organic diode which emits electromagnetic radiation, as a transistor which emits electromagnetic radiation or as an organic transistor which emits electromagnetic radiation. The radiation can be light in the visible range, UV light and/or infrared light, for example. In this connection, the component which emits electromagnetic radiation can be embodied for example as a light emitting diode (LED), as an organic light emitting diode (OLED), as a light emitting transistor or as an organic light emitting transistor. In various configurations, the light emitting component can be part of an integrated circuit. Furthermore, a plurality of light emitting components can be provided, for example in a manner accommodated in a common housing.

In the context of this description, an organic optoelectronic component in various configurations, for example as an organic light emitting diode (OLED), an organic photovoltaic installation, for example an organic solar cell, in the organic functional layer system may include or be formed from an organic substance or an organic substance mixture which is designed for example for providing electromagnetic radiation from an electric current provided or for providing an electric current from electromagnetic radiation provided.

In the context of this description, a harmful environmental influence can be understood to mean all influences which for example can potentially result in degradation, a crosslinked state, and/or crystallization of the organic substance or of the organic substance mixture and can thus limit the operating period of organic components, for example.

A harmful environmental influence can be for example a substance which is harmful to organic substances or organic substance mixtures, for example oxygen and/or for example a solvent, for example water.

A harmful environmental influence can be for example surroundings which are harmful to organic substances or organic substance mixtures, for example a change above or below a critical value, for example of the temperature, and/or a change in the ambient pressure.

In the context of this description, a layer hermetically impermeable with regard to water and/or oxygen can be understood as a substantially hermetically impermeable layer, wherein the layer can have diffusion channels. In the context of this description, a diffusion channel in a layer can be understood as a cavity in the layer having at least two openings, for example a hole, a pore, an interconnect or the like. A substance or substance mixture can migrate or diffuse through the diffusion channel from one opening of the diffusion channel to the at least one second opening of the diffusion channel, for example by an osmotic pressure or electrophoretically. A diffusion channel can be embodied in the layer for example in such a way that different sides of the layer are connected to one another by the diffusion channel (interconnect). A diffusion channel can have for example a diameter in a range of from approximately the diameter of a water molecule to approximately a few nm. A diffusion channel in a layer can be or be formed by for example defects, grain boundaries or the like in the layer. A hermetically impermeable layer can have for example a diffusion rate with regard to water and/or oxygen of less than approximately $10^{-1}$ g/(m$^2$d), and a hermetically impermeable cover and/or a hermetically impermeable carrier can have for example a diffusion rate with regard to water and/or oxygen of less than approximately $10^{-4}$ g/(m$^2$d), for example in a range of approximately $10^{-4}$ g/(m$^2$d) to approximately $10^{-10}$ g/(m$^2$d), for example in a range of approximately $10^{-4}$ g/(m$^2$d) to approximately $10^{-6}$ g/(m$^2$d).

In various embodiments, an optoelectronic component is provided, the optoelectronic component including: a carrier; a planar, electrically active region on or above the carrier; an adhesion layer on or above the electrically active region, wherein the adhesion layer at least partly surrounds the electrically active region; a cover on or above the adhesion layer, wherein a part of the adhesion layer is exposed; and an encapsulation on or above the exposed adhesion layer.

In the context of this description, at least partial surrounding can be embodied for example as at least partial surrounding from below, at least partial lateral surrounding and/or at least partial surrounding from above, for example complete surrounding.

In one configuration of the optoelectronic component, a barrier thin-film layer can be formed between the adhesion layer and the electrically active region, for example by the barrier thin-film layer being formed on or above the electrically active region, for example having physical contact with the electrically active region, for example hermetically sealing the electrically active region with regard to water and/or oxygen.

In other words: the encapsulation can be arranged in the lateral diffusion path of the adhesion layer, for example in the exposed part of the adhesion layer without contact with the cover and the electrically active region/barrier thin-film layer. Furthermore, the encapsulation can have a lower permeability with regard to at least water and/or oxygen than the lateral permeability of the adhesion layer. The encapsulation can at least partly surround the exposed adhesion layer in the sense of surrounding or enclosing the adhesion layer in a geometrically ring-shaped fashion and/or in the sense of: at least one part of the adhesion layer is laterally surrounded by the encapsulation, i.e. for example another part of the adhesion layer can surround the encapsulation. In one configuration of the optoelectronic component, by way of example, a further adhesion layer can surround the encapsulation, wherein the encapsulation at least partly surrounds the barrier thin-film layer of the adhesion layer in a geometrically ring-shaped fashion.

In one configuration of the optoelectronic component, the barrier thin-film layer may include or be formed from one of the following substances: a metal, a metal oxide, a ceramic.

In one configuration of the optoelectronic component, the barrier thin-film layer can have a layer thickness in a range of approximately 0.1 nm (one atomic layer) to approximately 1000 nm, for example in a range of approximately 10 nm to approximately 100 nm, for example in a range of approximately 40 nm.

In one configuration of the optoelectronic component, the barrier thin-film layer can have a plurality of partial layers, wherein all the partial layers can have the same layer thickness.

In one configuration of the optoelectronic component, the individual partial layers of the barrier thin-film layer can have different layer thicknesses. In other words, at least one of the partial layers can have a different layer thickness than one or a plurality of other partial layers.

In one configuration of the optoelectronic component, the barrier thin-film layer or the individual partial layers of the barrier thin-film layer can be embodied as translucent and/or transparent layer. In other words: the barrier thin-film layer or the individual partial layers of the barrier thin-film layer can be formed from a translucent and/or transparent substance (or a substance mixture which is translucent and/or transparent).

In one configuration of the optoelectronic component, the barrier thin-film layer or (in the case of a layer stack including a plurality of partial layers) one or a plurality of the partial layers of the barrier thin-film layer may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof.

In one configuration of the optoelectronic component, the barrier thin-film layer or (in the case of a layer stack including a plurality of partial layers) one or a plurality of the partial layers of the barrier thin-film layer may include one or a plurality of high refractive index substances, to put it another way one or a plurality of substances having a high refractive index, for example having a refractive index of at least 2.

In one configuration of the optoelectronic component, the adhesion layer can be embodied as translucent and/or transparent.

In one configuration of the optoelectronic component, the adhesion layer can have a layer thickness of greater than 1 μm, for example a layer thickness of a plurality of μm.

In one configuration of the optoelectronic component, the adhesion layer may include or be a lamination adhesive.

In one configuration of the optoelectronic component, the adhesion layer may include light-scattering particles which can lead to an improvement in the color angle distortion and the coupling-out efficiency, or a getter, for binding water, for example a zeolite or calcium oxide.

In one configuration of the optoelectronic component, the light-scattering particles provided can be for example dielectric scattering particles such as, for example, metal oxides such as e.g. silicon oxide ($SiO_2$), zinc oxide (ZnO), zirconium oxide ($ZrO_2$), indium tin oxide (ITO) or indium zinc oxide (IZO) gallium oxide ($Ga_2O_x$), aluminum oxide, or titanium oxide. Other particles can also be suitable, provided that they have a refractive index that differs from the effective refractive index of the matrix of the adhesion layer, for example air bubbles, acrylate, or hollow glass beads. Furthermore, by way of example, metallic nanoparticles, metals such as gold, silver, iron nanoparticles, or the like can be provided as light-scattering particles.

In one configuration of the optoelectronic component, the adhesion layer can be designed in such a way that the adhesion layer itself has a refractive index which is less than the refractive index of the cover. Such an adhesion layer can be for example a low refractive index adhesive such as, for example, an acrylate having a refractive index of approximately 1.3.

In one configuration of the optoelectronic component, the adhesion layer may include for example a high refractive index adhesive which includes for example high refractive index, non-scattering particles and has a mean refractive index which corresponds approximately to the mean refractive index of the electrically active region, for example in a range of approximately 1.7 to approximately 2.0, or greater. Furthermore, a plurality of different adhesives can be provided, which form an adhesive layer sequence.

In one configuration of the optoelectronic component, the adhesion layer can have a refractive index which is greater than the refractive index of the cover and less than the refractive index of the electrically active region and/or of the barrier thin-film layer.

In one configuration of the optoelectronic component, the cover and/or the adhesion layer can have a refractive index (for example at a wavelength of 633 nm) of 1.55.

In one configuration of the optoelectronic component, the cover can be designed as a glass cover, metal cover or plastics cover.

In one configuration of the optoelectronic component, the cover can be embodied as hermetically impermeable, for example as a barrier film. A barrier film can be embodied for example as a plastics film with a barrier layer on or above the plastics film.

In one configuration of the optoelectronic component, the exposed adhesion layer can at least partly laterally surround the electrically active region.

In other words: the encapsulation can be formed laterally on or above the adhesion layer or on or above the adhesion layer and the cover in such a way that the encapsulation at least partly laterally surrounds the electrically active region.

In one configuration of the optoelectronic component, the cover, the carrier and the encapsulation can be embodied in such a way that the electrically active region is hermetically impermeable with regard to at least water and/or oxygen.

In one configuration of the optoelectronic component, the encapsulation can have a cohesive connection to the cover and/or the carrier, for example to a hermetically impermeable cover and/or a hermetically impermeable carrier.

In one configuration of the optoelectronic component, the encapsulation may include or be formed from a hermetically impermeable substance.

In one configuration of the optoelectronic component, the encapsulation may include or be formed from one of the following substances: a metal, a metal oxide, a ceramic or the like, for example a glass.

In one configuration of the optoelectronic component, the encapsulation may include or be formed from an inorganic substance.

In one configuration of the optoelectronic component, the encapsulation may include or be formed from one of the following substances: a glass, quartz glass, sapphire, silicon carbide, graphene, diamond or the like.

In one configuration of the optoelectronic component, the encapsulation or (in the case of a layer stack including a plurality of partial layers) one or a plurality of the partial layers of the encapsulation may include or be formed from a substance, an alloy or a metal oxide composed of one of the following substances: iron, steel, aluminum, copper, silver, gold, palladium, magnesium, titanium, platinum, nickel, tin, zinc, aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, or the like.

In one configuration of the optoelectronic component, the encapsulation may include or be formed from an organic substance.

In one configuration of the optoelectronic component, the encapsulation may include or be formed from one of the following substances: polyolefins (for example high or low density polyethylene (PE) or polypropylene (PP)), polyvinyl chloride (PVC), polystyrene (PS), polyester, polycarbonate (PC), polyethylene terephthalate (PET), polyether sulfone (PES), polyethylene naphthalate (PEN), polymethyl methacrylate (PMMA), polyimide (PI), polyether ketones (PEEK), polyimide (PI), a fluorine derivative or the like.

In one configuration of the optoelectronic component, the encapsulation can have a layer thickness in a range of approximately 0.1 nm (one atomic layer) to approximately 1 mm, for example a layer thickness in a range of approximately 1 μm to approximately 100 μm, for example approximately 50 μm.

In one configuration of the optoelectronic component, the encapsulation can have a plurality of partial layers, wherein all the partial layers can have the same layer thickness.

In one configuration of the optoelectronic component, the individual partial layers of the encapsulation can have different layer thicknesses. In other words: at least one of the partial layers can have a different layer thickness than one or a plurality of other partial layers.

In one configuration of the optoelectronic component, the encapsulation or the individual partial layers of the encapsulation can be embodied as translucent and/or transparent layer.

In other words: the encapsulation or the individual partial layers of the encapsulation can be formed from a translucent and/or transparent substance (or a substance mixture which is translucent and/or transparent).

In one configuration of the optoelectronic component, the encapsulation or (in the case of a layer stack including a plurality of partial layers) one or a plurality of the partial layers of the encapsulation may include one or a plurality of high refractive index substances, to put it another way one or a plurality of substances having a high refractive index, for example having a refractive index of at least 2.

In one configuration of the optoelectronic component, the surface of the encapsulation can be structured, for example have a nanoroughness and/or microroughness, for example in order to form a lotus effect.

In one configuration of the optoelectronic component, the encapsulation can be designed similarly or identically to the barrier thin-film layer.

In other words: the encapsulation can be designed similarly or identically to one of the configurations of the barrier thin-film layer.

In one configuration of the optoelectronic component, the substance or the substance mixture of the encapsulation can be embodied similarly or identically to the substance or substance mixture of the barrier thin-film layer.

In one configuration of the optoelectronic component, the adhesion layer can be designed for sealing the barrier thin-film layer with regard to at least water and/or oxygen, for example with regard to diffusion channels in the barrier thin-film layer. The adhesion layer seals the barrier thin-film layer in the sense that the diffusion rate of water and/or oxygen toward the barrier thin-film layer is reduced, for example with regard to the case without an adhesion layer, i.e. with a barrier thin-film layer in air. In other words: the adhesion layer seals the barrier thin-film layer in the sense that the period of time for water and/or oxygen to reach the barrier thin-film layer is increased.

In one configuration of the optoelectronic component, the encapsulation can is designed for sealing the exposed adhesion layer with regard to at least water and/or oxygen, for example with regard to diffusion channels in the adhesion layer.

In one configuration of the optoelectronic component, the encapsulation can be embodied in such a way that the permeability of the encapsulation is less than the lateral permeability of the adhesion layer with regard to the diffusion of water and/or oxygen.

In one configuration of the optoelectronic component, the diffusion rate of the encapsulation with regard to at least water can be less than the lateral diffusion rate of the adhesion layer with regard to at least water.

In one configuration of the optoelectronic component, the diffusion rate of the encapsulation with regard to at least water can be less than the lateral diffusion rate of the adhesion layer with regard to at least water at least by a factor of approximately 10.

In one configuration of the optoelectronic component, the diffusion rate through the encapsulation can be less than approximately $10^{-1}$ g/(m$^2$d), for example less than approximately $10^{-2}$ g/(m$^2$d), for example less than approximately $10^{-3}$ g/(m$^2$d), for example in a range of approximately $10^{-6}$ g/(m$^2$d) to approximately $10^{-10}$ g/(m$^2$d).

In one configuration of the optoelectronic component, the encapsulation can laterally completely surround the exposed adhesion layer.

In one configuration of the optoelectronic component, the encapsulation can have a continuous shape.

In one configuration of the optoelectronic component, the continuous shape may include a geometrical shape similar or identical to a geometrical ring, for example a geometrical shape of an ellipse, a circle, triangle, quadrilateral or polygon. In this case, the continuous shape relates to a closed geometrical shape in a cross-sectional view.

In one configuration of the optoelectronic component, the adhesion layer can have at least one electrical feedthrough for making electrical contact with the electrically active region.

In one configuration of the optoelectronic component, the carrier can have at least one electrical feedthrough for making electrical contact with the electrically active region.

In one configuration of the optoelectronic component, the barrier thin-film layer can be cohesively connected to the electrically active region.

In one configuration of the optoelectronic component, the electrically active region can have at least one organic functional layer system, a first electrode and at least one second electrode, wherein the organic functional layer system is formed between the first electrode and the second electrode, and wherein the electrodes are designed for making electrical contact with the organic functional layer system.

In one configuration of the optoelectronic component, the cover can be embodied in such a way that the cover surrounds the electrically active region and the carrier, for example by the cover being arranged on or above the electrically active region for example by the adhesion layer and the cover being at least partly folded around the carrier and being for example closely connected to the carrier by the adhesion layer for example on the rear side of the optoelectronic component. In other words: in various configurations, the exposed adhesion layer can be arranged on at least one side surfaces and/or the rear side of the optoelectronic component. In various configurations, the rear side of the optoelectronic component can also be designated as the rear side of the carrier, wherein the electrically active region is formed on the front side of the carrier.

In one configuration of the optoelectronic component, the encapsulation can be formed on or above the exposed adhesion layer and at least partly on or above the cover, for example hermetically seal the connection of exposed adhesion layer and cover with regard to at least water and/or oxygen, for example by the encapsulation at least partly surrounding the cover.

In one configuration of the optoelectronic component, the cover can be structured on the rear side of the carrier.

In one configuration of the optoelectronic component, the cover on the rear side of the carrier can at least partly overlap.

In one configuration of the optoelectronic component, the overlapping regions of the cover can be structured in such a way that they are connected to one another in a positively locking manner and/or in a force-locking manner, for example intermesh, for example complementarily.

In one configuration of the optoelectronic component, the optoelectronic component can furthermore include an anti-scratch protective layer arranged between the electrically active region and the adhesion layer.

In one configuration of the optoelectronic component, the anti-scratch protective layer can have a mean refractive index which is greater than the mean refractive index of the adhesion layer.

In one configuration of the optoelectronic component, the anti-scratch protective layer can be embodied as a matrix and scattering centers distributed therein.

In one configuration of the optoelectronic component, the anti-scratch protective layer can be embodied as an optical filter.

In one configuration of the optoelectronic component, the anti-scratch protective layer can be embodied as an optical lens.

In one configuration of the optoelectronic component, the anti-scratch protective layer may include a getter.

In one configuration of the optoelectronic component, the cover can be structured in such a way that at least one electrical feedthrough for making electrical contact with the electrically active region is formed through or alongside the cover.

In another configuration, the electrical feedthroughs through the cover can be hermetically sealed with an electrically conductive material.

In one configuration of the optoelectronic component, the optoelectronic component can be designed as an organic, optoelectronic component, for example an organic solar cell, an organic sensor or an organic light emitting diode.

In various embodiments, a method for producing an optoelectronic component is provided, the method including: providing a planar, electrically active region on or above the carrier; forming an adhesion layer on or above the electrically active region, wherein the adhesion layer at least partly surrounds the electrically active region; forming a cover on or above the adhesion layer, wherein a part of the adhesion layer is exposed; and forming an encapsulation on or above the exposed adhesion layer.

In one configuration of the method, the method can furthermore include forming a barrier thin-film layer on or above the electrically active region, for example before forming the adhesion layer on or above the electrically active region, for example by the barrier thin-film layer being formed on or above the electrically active region, for example having physical contact with the electrically active region, for example hermetically sealing the electrically active region with regard to water and/or oxygen.

In one configuration of the method, the barrier thin-film layer may include or be formed from one of the following substances: a metal, a metal oxide, a ceramic.

In one configuration of the method, the barrier thin-film layer can be embodied with a layer thickness in a range of approximately 0.1 nm (one atomic layer) to approximately 1000 nm, for example in a range of approximately 10 nm to approximately 100 nm, for example in a range of approximately 40 nm.

In one configuration of the method, the barrier thin-film layer can be formed from a plurality of partial layers, wherein all the partial layers can have the same layer thickness.

In one configuration of the method, the individual partial layers of the barrier thin-film layer can have different layer thicknesses. In other words: at least one of the partial layers can have a different layer thickness than one or a plurality of other partial layers.

In one configuration of the method, the barrier thin-film layer or the individual partial layers of the barrier thin-film layer can be embodied as translucent and/or transparent layer. In other words: the barrier thin-film layer or the individual partial layers of the barrier thin-film layer can be formed from a translucent and/or transparent substance (or a substance mixture which is translucent and/or transparent).

In one configuration of the method, the barrier thin-film layer or (in the case of a layer stack including a plurality of partial layers) one or a plurality of the partial layers of the barrier thin-film layer may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof.

In one configuration of the method, the barrier thin-film layer or (in the case of a layer stack including a plurality of partial layers) one or a plurality of the partial layers of the barrier thin-film layer may include one or a plurality of high refractive index substances, to put it another way one or a plurality of substances having a high refractive index, for example having a refractive index of at least 2.

In one configuration of the method, the adhesion layer can be embodied as translucent and/or transparent.

In one configuration of the method, the adhesion layer can be embodied with a layer thickness of greater than approximately 1 µm, for example with a layer thickness of a plurality of µm.

In one configuration of the method, the adhesion layer may include or be a lamination adhesive.

In one configuration of the method, the adhesion layer can be formed with light-scattering particles, wherein the particles can lead to an improvement in the color angle distortion and the coupling-out efficiency, or include a getter, for example getter particles which are designed for binding water and/or oxygen, for example include a zeolite or calcium oxide.

In one configuration of the method, the light-scattering particles provided can be for example dielectric scattering particles such as, for example, metal oxides such as e.g. silicon oxide ($SiO_2$), zinc oxide (ZnO), zirconium oxide ($ZrO_2$), indium tin oxide (ITO) or indium zinc oxide (IZO) gallium oxide ($Ga_2O_x$), aluminum oxide, or titanium oxide. Other particles can also be suitable, provided that they have a refractive index that differs from the effective refractive index of the matrix of the adhesion layer, for example air bubbles, acrylate, or hollow glass beads. Furthermore, by way of example, metallic nanoparticles, metals such as gold, silver, iron nanoparticles, or the like can be provided as light-scattering particles.

In one configuration of the method, the adhesion layer can be designed in such a way that the adhesion layer itself has a refractive index which is less than the refractive index of the cover. Such an adhesion layer can be for example a low refractive index adhesive such as, for example, an acrylate having a refractive index of approximately 1.3.

In one configuration of the method, the adhesion layer can be formed from for example a high refractive index adhesive which includes for example high refractive index, non-scattering particles and has a mean refractive index which corresponds approximately to the mean refractive index of the electrically active region, for example in a range of approximately 1.7 to approximately 2.0, or greater. Furthermore, a plurality of different adhesives can be provided, which form an adhesive layer sequence.

In one configuration of the method, the cover and/or the adhesion layer can have a refractive index (for example at a wavelength of 633 nm) of 1.55.

In one configuration of the method, the cover can be designed as a glass cover, metal cover or plastics cover.

In one configuration of the optoelectronic component, the cover can be embodied as hermetically impermeable, for example as a barrier film. A barrier film can be embodied for example as a plastics film with a barrier layer on or above the plastics film.

In one configuration of the method, the encapsulation can be formed after the process of forming the cover on or above the exposed adhesion layer.

In one configuration of the method, the cover can be formed after the process of forming the encapsulation.

In one configuration of the method, the encapsulation can be formed after the process of forming the adhesion layer.

In one configuration of the method, the cover, the carrier and the encapsulation can be designed or formed in such a way that the electrically active region is hermetically sealed with regard to at least water and/or oxygen.

In other words: the encapsulation can be formed laterally on or above the adhesion layer or on or above the adhesion layer and the cover such that the carrier, the cover and the encapsulation surrounds the electrically active region.

In one configuration of the method, the encapsulation can be cohesively connected to the cover and/or the carrier, for example to a hermetically impermeable cover and/or a hermetically impermeable carrier.

In one configuration of the method, the encapsulation can be applied to the side surfaces of the adhesion layer in a formable state. The encapsulation can be solidified after application. The encapsulation can have a dimensionally stable state after solidification.

In one configuration, the temperature during the process of forming the encapsulation can be less than approximately 150° C., for example less than approximately 120° C., for example in a temperature range of approximately 90° C. to approximately 100° C.

In one configuration, the encapsulation can be formed wet-chemically, for example from a paste, a gel, a solution, a suspension or a dispersion.

In one configuration, the encapsulation can be designed and/or applied similarly or identically to an adhesive.

In one configuration of the method, the encapsulation may include or be formed from a hermetically impermeable substance.

In one configuration of the method, the encapsulation may include or be formed from one of the following substances: a metal, a metal oxide, a ceramic or the like, for example a glass.

In one configuration of the method, the encapsulation may include or be formed from an inorganic substance.

In one configuration of the method, the encapsulation may include or be formed from one of the following substances: a glass, quartz glass, sapphire, silicon carbide, graphene, diamond or the like.

In one configuration of the method, the encapsulation or (in the case of a layer stack including a plurality of partial layers) one or a plurality of the partial layers of the encapsulation may include or be formed from a substance, an alloy or a metal oxide composed of one of the following substances: iron, steel, aluminum, copper, silver, gold, palladium, magnesium, titanium, platinum, nickel, tin, zinc, aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, or the like.

In one configuration of the optoelectronic component, the encapsulation may include or be formed from an organic substance.

In one configuration of the method, the encapsulation may include or be formed from one of the following substances: polyolefins (for example high or low density polyethylene (PE) or polypropylene (PP)), polyvinyl chloride (PVC), polystyrene (PS), polyester, polycarbonate (PC), polyethylene terephthalate (PET), polyether sulfone (PES), polyethylene naphthalate (PEN), polymethyl methacrylate (PMMA), polyimide (PI), polyether ketones (PEEK), a polyimide (PI), a fluorine derivative or the like.

In one configuration of the method, the encapsulation can be embodied with a layer thickness in a range of approximately 0.1 nm (one atomic layer) to approximately 1 mm, for example a layer thickness in a range of approximately 10 μm to approximately 100 μm, for example in a range of approximately 50 μm.

In one configuration of the method, the encapsulation can be formed from a plurality of partial layers, wherein all the partial layers can have the same layer thickness.

In one configuration of the method, the individual partial layers of the encapsulation can be embodied with different layer thicknesses. In other words: at least one of the partial layers can have a different layer thickness than one or a plurality of other partial layers.

In one configuration of the method, the encapsulation or the individual partial layers of the encapsulation can be embodied as translucent and/or transparent layer.

In other words: the encapsulation or the individual partial layers of the encapsulation can be formed from a translucent and/or transparent substance (or a substance mixture which is translucent and/or transparent).

In one configuration of the method, the encapsulation or (in the case of a layer stack including a plurality of partial layers) one or a plurality of the partial layers of the encapsulation may include or be formed from one or a plurality of high refractive index substances, to put it another way one or a plurality of substances having a high refractive index, for example having a refractive index of at least 2.

In one configuration of the method, the surface of the encapsulation can be structured, for example a nanoroughness and/or microroughness can be formed, for example in order to form a lotus effect.

In one configuration of the method, the encapsulation can be electrically non-conductive or have electrically non-conductive surfaces. As a result, no electrical short circuit can occur by the encapsulation.

In one configuration of the method, the encapsulation can be formed similarly or identically to the barrier thin-film layer.

In one configuration of the method, the substance or the substance mixture of the encapsulation can be designed similarly or identically to the substance or substance mixture of the barrier thin-film layer.

In one configuration of the method, the adhesion layer can be formed in such a way that the barrier thin-film layer is sealed with regard to at least water and/or oxygen, in particular with regard to diffusion channels in the barrier thin-film layer. The adhesion layer seals the barrier thin-film layer in the sense that the diffusion rate of water and/or oxygen of the layer which has physical contact with the barrier thin-film layer is reduced, for example with regard to the case without an adhesion layer, i.e. with a barrier thin-film layer in air. In other words: the adhesion layer seals the barrier thin-film layer in the sense that the period of time for water and/or oxygen to reach the barrier thin-film layer is increased.

In one configuration of the method, the encapsulation can be formed in such a way that the adhesion layer is sealed with regard to at least water and/or oxygen, in particular with regard to diffusion channels in the adhesion layer.

In one configuration of the method, the encapsulation can be formed in such a way that the permeability of the encapsulation with regard to the diffusion of water and/or oxygen is less than the lateral permeability of the adhesion layer.

In one configuration of the method, the encapsulation can be formed in such a way that the diffusion rate of the encapsulation with regard to at least water is less than the lateral diffusion rate of the adhesion layer with regard to at least water.

In one configuration of the method, the diffusion rate of the encapsulation with regard to at least water can be less than the lateral diffusion rate of the adhesion layer with regard to at least water at least by a factor of approximately 10.

In one configuration of the method, the diffusion rate through the encapsulation can be less than approximately $10^{-1}$ g/(m$^2$d), for example less than approximately $10^{-2}$ g/(m$^2$d), for example less than approximately $10^{-3}$ g/(m$^2$d), for example in a range of approximately $10^{-6}$ g/(m$^2$d) to approximately $10^{-10}$ g/(m$^2$d).

In one configuration of the method, the encapsulation can be formed in such a way that the encapsulation laterally completely surrounds the adhesion layer.

In one configuration of the method, the encapsulation can be formed in a continuous shape.

In one configuration of the method, the continuous shape may include a geometrical shape similar or identical to a geometrical ring, for example a geometrical shape of an ellipse, a circle, triangle, quadrilateral or polygon. In this case, the continuous shape relates to a closed geometrical shape in a cross-sectional view.

In one configuration of the method, the method can furthermore include forming at least one electrical feedthrough in the encapsulation, wherein the electrical feedthrough is designed for making electrical contact with the electrically active region.

In one configuration of the method, forming the electrical feedthrough in the encapsulation may include exposing a contact pad below the encapsulation.

In one configuration of the method, the method can furthermore include forming at least one electrical feedthrough in the adhesion layer, wherein the electrical feedthrough is designed for making electrical contact with the electrically active region.

In one configuration of the method, the method can furthermore include forming at least one electrical feedthrough in the carrier, wherein the electrical feedthrough is designed for making electrical contact with the electrically active region.

In one configuration of the method, the encapsulation can be formed simultaneously on a plurality of electronic components, for example by the plurality of electronic components being stacked one above another in a planar fashion. As a result, it is possible simultaneously to prevent the planar surface of the electronic components prior to forming the encapsulation on or above the cover, for example if the encapsulation is not translucent and/or transparent, but the adhesion layer and encapsulation is/are intended to be embodied as translucent and/or transparent.

In one configuration of the method, the barrier thin-film layer can be cohesively connected to the electrically active region.

In one configuration of the method, the electrically active region can has at least one organic functional layer system, at least one first electrode and at least one second electrode, wherein the organic functional layer system is formed between the first electrode and the second electrode, and wherein the electrodes are designed for making electrical contact with the organic functional layer system.

In one configuration of the method, the cover can be embodied in such a way that the cover surrounds the electrically active region and the carrier, for example by the cover being arranged on or above the electrically active region for example by the adhesion layer and the cover being at least partly folded around the carrier and being closely connected to the carrier by the adhesion layer for example on the rear side of the optoelectronic component. In other words: in various configurations, the exposed adhesion layer can be arranged on at least one side surfaces and/or the rear side of the optoelectronic component.

In one configuration of the method, the encapsulation can be formed on or above the exposed adhesion layer and at least partly on or above the cover, for example hermetically seal the connection of exposed adhesion layer and cover with regard to at least water and/or oxygen, for example by the encapsulation at least partly surrounding the cover.

In one configuration of the method, the regions of the cover can be structured on the rear side of the carrier.

In one configuration of the method, the cover on the rear side of the carrier can be arranged at least partly overlapping.

In one configuration of the method, the overlapping regions of the cover can be structured in such a way that they are connected to one another in a positively locking manner and/or in a force-locking manner, for example intermesh, for example complementarily.

In one configuration of the method, an anti-scratch protective layer can furthermore be formed between the electrically active region and the adhesion layer.

In one configuration of the method, the anti-scratch protective layer can be formed in such a way that the anti-scratch protective layer has a mean refractive index which is greater than the mean refractive index of the adhesion layer.

In one configuration of the method, the anti-scratch protective layer can be embodied as a matrix and scattering centers distributed therein.

In one configuration of the method, the anti-scratch protective layer can be embodied as an optical filter.

In one configuration of the method, the anti-scratch protective layer can be embodied as an optical lens.

In one configuration of the method, the anti-scratch protective layer may include a getter.

In one configuration of the method, the cover can be structured in such a way that at least one electrical feedthrough for making electrical contact with the electrically active region is formed through or alongside the cover.

In another configuration, the electrical feedthroughs through the cover can be hermetically sealed with an electrically conductive material.

In one configuration of the method, the optoelectronic component can be embodied as an organic, optoelectronic component, for example an organic solar cell, an organic sensor or an organic light emitting diode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 shows a schematic cross-sectional view of an optoelectronic component, in accordance with various embodiments;

FIGS. 2A and 2B show schematic cross-sectional views of an optoelectronic component, in accordance with various embodiments;

FIG. 3 shows a diagram of one method for producing an optoelectronic component, in accordance with various configurations;

DETAILED DESCRIPTION

Figure 4A:
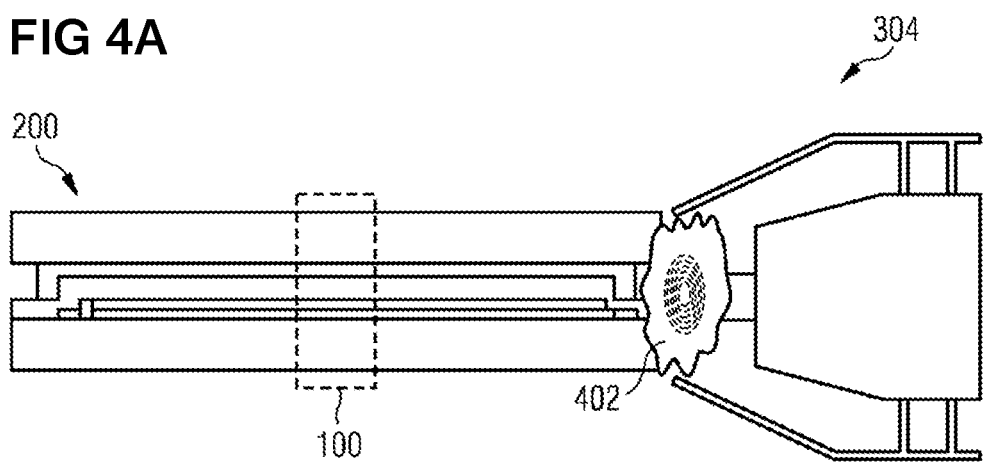
FIGS. 4A and 4B show schematic cross-sectional views of an optoelectronic component in the method for producing an optoelectronic component, in accordance with various configurations.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling.

In the figures, identical or similar elements are provided with identical reference signs, insofar as this is expedient.

FIG. 1 shows a schematic cross-sectional view of an optoelectronic component, in accordance with various embodiments.

The optoelectronic component 100, for example an electronic component 100 which provides electromagnetic radiation, for example a light emitting component 100, for example in the form of an organic light emitting diode 100, can have a carrier 102. The carrier 102 can serve for example as a carrier element for electronic elements or layers, for example light emitting elements. By way of example, the carrier 102 may include or be formed from glass, quartz and/or a semiconductor material or any other suitable substance. Furthermore, the carrier 102 may include or be formed from a plastics film or a laminate including one or including a plurality of plastics films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The carrier 102 may include one or more of the substances mentioned above. The carrier 102 may include or be formed from a metal or a metal compound, for example copper, silver, gold, platinum or the like.

A carrier 102 including a metal or a metal compound can also be embodied as a metal film or a metal-coated film. The carrier 102 can be embodied as translucent or even transparent.

In various embodiments, the term "translucent" or "translucent layer" can be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light emitting diode 100 (or else the light emitting components in accordance with the embodiments that have been described above or will be described below) can be designed as a so-called top and bottom emitter. A top and/or bottom emitter can also be designated as an optically transparent component, for example a transparent organic light emitting diode.

In various embodiments, a barrier layer 104 can optionally be arranged on or above the carrier 102. The barrier layer 104 may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 106 of the light emitting component 100 can be arranged on or above the barrier layer 104. The electrically active region 106 can be understood as that region of the light emitting component 100 in which an electric current for the operation of the light emitting component 100 flows. In various embodiments, the electrically active region 106 may include a first electrode 110, a second electrode 114 and an organic functional layer structure 112, as are explained in even greater detail below.

In this regard, in various embodiments, the first electrode 110 (for example in the form of a first electrode layer 110) can be applied on or above the barrier layer 104 (or, if the barrier layer 104 is not present, on or above the carrier 102). The first electrode 110 (also designated hereinafter as bottom electrode 110) can be formed from an electrically conductive substance, such as, for example, a metal or a transparent conductive oxide (TCO) or a layer stack including a plurality of layers of the same metal or different metals and/or the same TCO or different TCOs. Transparent conductive oxides are transparent conductive substances, for example metal oxides, such as, for example, zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 110 may include a metal; for example Ag, Pt, Au, Mg, Al, Ba, In, Ca, Sm or Li, and compounds, combinations or alloys of these materials.

In various embodiments, the first electrode 110 can be formed by a layer stack of a combination of a layer of a metal on a layer of a TCO, or vice versa. One example is a silver layer applied on an indium tin oxide layer (ITO) (Ag on ITO) or ITO—Ag-ITO multilayers.

In various embodiments, the first electrode 110 may include one or a plurality of the following substances as an alternative or in addition to the abovementioned substances: networks composed of metallic nanowires and nanoparticles, for example composed of Ag; networks composed of carbon nanotubes; graphene particles and graphene layers; networks composed of semiconducting nanowires.

Furthermore, the first electrode 110 may include electrically conductive polymers or transition metal oxides or transparent electrically conductive oxides.

In various embodiments, the first electrode 110 and the carrier 102 can be formed as translucent or transparent. In the case where the first electrode 110 includes or is formed from a metal, the first electrode 110 can have for example a layer thickness of less than or equal to approximately 25 nm, for example a layer thickness of less than or equal to approximately 20 nm, for example a layer thickness of less than or equal to approximately 18 nm. Furthermore, the first electrode 110 can have for example a layer thickness of greater than or equal to approximately 10 nm, for example a layer thickness of greater than or equal to approximately 15 nm. In various embodiments, the first electrode 110 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 110 includes or is formed from a transparent conductive oxide (TCO), the first electrode 110 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 110 are formed from, for example, a network composed of metallic nanowires, for example composed of Ag, which can be combined with conductive polymers, a network composed of carbon nanotubes which can be combined with conductive polymers, or from graphene layers and composites, the first electrode 110 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 110 can be formed as an anode, that is to say as a hole-injecting electrode, or as a cathode, that is to say as an electron-injecting electrode.

The first electrode 110 can have a first electrical contact pad, to which a first electrical potential (provided by an energy source (not illustrated), for example a current source or a voltage source) can be applied. Alternatively, the first electrical potential can be applied to the carrier 102 and then be applied indirectly to the first electrode 110 via said carrier. The first electrical potential can be, for example, the ground potential or some other predefined reference potential.

Furthermore, the electrically active region 106 of the light emitting component 100 can have an organic functional layer structure 112, which is applied or formed on or above the first electrode 110.

The organic functional layer structure 112 may include one or a plurality of emitter layers 118, for example including fluorescent and/or phosphorescent emitters, and one or a plurality of hole-conducting layers 116 (also designated as hole transport layer(s) 120). In various embodiments, one or a plurality of electron-conducting layers 116 (also designated as electron transport layer(s) 116) can alternatively or additionally be provided.

Examples of emitter materials which can be used in the light emitting component 100 in accordance with various embodiments for the emitter layer(s) 118 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent $Ir(ppy)_3$ (tris(2-phenylpyridine)iridium III), red phosphorescent Ru $(dtb-bpy)_3*2(PF_6)$ (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited by thermal evaporation, for example. Furthermore, it is possible to use polymer emitters, which can be deposited, in particular, by a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) 118 of the light emitting component 100 can be selected for example such that the light emitting component 100 emits white light. The emitter layer(s) 118 may include a plurality of emitter materials that emit in different colors (for example blue and yellow or blue, green and red); alternatively, the emitter layer(s) 118 can also be constructed from a plurality of partial layers, such as a blue fluorescent emitter layer 118 or blue phosphorescent emitter layer 118, a green phosphorescent emitter layer 118 and a red phosphorescent emitter layer 118. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure 112 can generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic functional layer structure 112 may include one or a plurality of electroluminescent layers embodied as a hole transport layer 120, so as to enable for example in the case of an OLED an effective hole injection into an electroluminescent layer or an electroluminescent region. Alternatively, in various embodiments, the organic functional layer structure 112 may include one or a plurality of functional layers embodied as an electron transport layer 116, so as to enable for example in an OLED an effective electron injection into an electroluminescent layer or an electroluminescent region. By way of example, tertiary amines, carbazole derivatives, conductive polyaniline or polyethylene dioxythiophene can be used as material for the hole transport layer 120. In various embodiments, the one or the plurality of electroluminescent layers can be embodied as an electroluminescent layer.

In various embodiments, the hole transport layer 120 can be applied, for example deposited, on or above the first electrode 110, and the emitter layer 118 can be applied, for example deposited, on or above the hole transport layer 120. In various embodiments, the electron transport layer 116 can be applied, for example deposited, on or above the emitter layer 118.

In various embodiments, the organic functional layer structure 112 (that is to say for example the sum of the thicknesses of hole transport layer(s) 120 and emitter layer(s) 118 and electron transport layer(s) 116) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 112 can have for example a stack of a plurality of organic light emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 112 can have for example a stack of two, three or four OLEDs arranged directly one above another, in which case for example the organic functional layer structure 112 can have a layer thickness of a maximum of approximately 3 µm.

The light emitting component 100 can optionally generally include further organic functional layers, for example arranged on or above the one or the plurality of emitter layers 118 or on or above the electron transport layer(s) 116, which serve to further improve the functionality and thus the efficiency of the light emitting component 100.

The second electrode 114 (for example in the form of a second electrode layer 114) can be applied on or above the organic functional layer structure 112 or, if appropriate, on or above the one or the plurality of further organic functional layer structures.

In various embodiments, the second electrode 114 may include or be formed from the same substances as the first electrode 110, metals being particularly suitable in various embodiments.

In various embodiments, the second electrode 114 (for example for the case of a metallic second electrode 114) can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 114 can generally be formed in a similar manner to the first electrode 110, or differently than the latter. In various embodiments, the second electrode 114 can be formed from one or more of the substances and with the respective layer thickness, as described above in connection with the first electrode 110. In various embodiments, both the first electrode 110 and the second electrode 114 are formed as translucent or transparent. Consequently, the light emitting component 100 illustrated in FIG. 1 can be embodied as a top and bottom emitter (to put it another way as a transparent light emitting component 100).

The second electrode 114 can be formed as an anode, that is to say as a hole-injecting electrode, or as a cathode, that is to say as an electron-injecting electrode.

The second electrode 114 can have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 108, for example in the form of a barrier thin-film layer/thin-film encapsulation 108, can optionally also be formed on or above the second electrode 114 and thus on or above the electrically active region 106.

In the context of this application, a "barrier thin-film layer" 108 or a "barrier thin film" 108 can be understood to mean, for example, a layer or a layer structure which is suitable for forming a barrier against chemical impurities or atmospheric substances, in particular against water (moisture) and oxygen. In other words, the barrier thin-film layer 108 is formed in such a way that OLED-damaging substances such as water, oxygen or solvent cannot penetrate through it or at most very small proportions of said substances can penetrate through it.

In accordance with one configuration, the barrier thin-film layer 108 can be formed as an individual layer (to put it another way, as a single layer). In accordance with an alternative configuration, the barrier thin-film layer 108 may include a plurality of partial layers formed one on top of another. In other words, in accordance with one configuration, the barrier thin-film layer 108 can be formed as a layer stack. The barrier thin-film layer 108 or one or a plurality of partial layers of the barrier thin-film layer 108 can be formed for example by a suitable deposition method, e.g. by an atomic layer deposition (ALD) method in accordance with one configuration, e.g. a plasma enhanced atomic layer deposition (PEALD) method or a plasmaless atomic layer deposition (PLALD) method, or by a chemical vapor deposition (CVD) method in accordance with another configuration, e.g. a plasma enhanced chemical vapor deposition (PECVD) method or a plasmaless chemical vapor deposition (PLCVD) method, or alternatively by other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 108 having a plurality of partial layers, all the partial layers can be formed by an atomic layer deposition method. A layer sequence including only ALD layers can also be designated as a "nanolaminate".

In accordance with an alternative configuration, in the case of a barrier thin-film layer 108 including a plurality of partial layers, one or a plurality of partial layers of the barrier thin-film layer 108 can be deposited by a different deposition method than an atomic layer deposition method, for example by a vapor deposition method.

In accordance with one configuration, the barrier thin-film layer 108 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 108 includes a plurality of partial layers, all the partial layers can have the same layer thickness. In accordance with another configuration, the individual partial layers of the barrier thin-film layer 108 can have different layer thicknesses. In other words, at least one of the partial layers can have a different layer thickness than one or more other partial layers.

In accordance with one configuration, the barrier thin-film layer 108 or the individual partial layers of the barrier thin-film layer 108 can be formed as a translucent or transparent layer. In other words, the barrier thin-film layer 108 (or the individual partial layers of the barrier thin-film layer 108) can consist of a translucent or transparent substance (or a substance mixture that is translucent or transparent).

In accordance with one configuration, the barrier thin-film layer 108 or (in the case of a layer stack having a plurality of partial layers) one or a plurality of the partial layers of the barrier thin-film layer 108 may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 108 or (in the case of a layer stack having a plurality of partial layers) one or a plurality of the partial layers of the barrier thin-film layer 108 may include one or a plurality of high refractive index materials, to put it another way one or a plurality of materials having a high refractive index, for example having a refractive index of at least 2.

In one configuration, the cover 126, for example composed of glass, can be applied for example by frit bonding (glass frit bonding/glass soldering/seal glass bonding) to the barrier thin-film layer 108 by a conventional glass solder in the geometrical edge regions of the organic optoelectronic component 100.

In various embodiments, on or above the barrier thin-film layer 108, it is possible to provide an adhesive and/or a protective lacquer 124, by which, for example, a cover 126 (for example a glass cover 126, a metal film covering 126, a sealed plastics film cover 126) is fixed, for example adhesively bonded, on the barrier thin-film layer 108. In various embodiments, the optically translucent layer composed of adhesive and/or protective lacquer 124 can have a layer thickness of greater than 1 μm, for example a layer thickness of several μm. In various embodiments, the adhesive may include or be a lamination adhesive.

In various embodiments, light-scattering particles can also be embedded into the layer of the adhesive (also designated as adhesive layer), which particles can lead to a further improvement in the color angle distortion and the coupling-out efficiency. In various embodiments, the light-scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2Oa$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 114 and the layer composed of adhesive and/or protective lacquer 124, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, the adhesive can be designed in such a way that it itself has a refractive index which is less than the refractive index of the cover 126. Such an adhesive can be for example a low refractive index adhesive such as, for example, an acrylate which has a refractive index of approximately 1.3. In one configuration, an adhesive can be for example a high refractive index adhesive which includes for example high refractive index, non-scattering particles and has a mean refractive index corresponding approximately to the mean refractive index of the organic functional layer structure, for example in a range of approximately 1.7 to approximately 2.0. Furthermore, a plurality of different adhesives can be provided which form an adhesive layer sequence.

Furthermore, it should be pointed out that, in various embodiments, an adhesive 124 can also be completely dispensed with, for example in configurations in which the cover 126, for example composed of glass, are applied to the barrier thin-film layer 108 by plasma spraying, for example.

In various embodiments, the cover 126 and/or the adhesive 124 can have a refractive index (for example at a wavelength of 633 nm) of 1.55.

Furthermore, in various embodiments, one or a plurality of antireflective layers (for example combined with the encapsulation 108, for example the barrier thin-film layer 108) can additionally be provided in the light emitting component 100.

In various embodiments, the barrier thin-film layer 108, the adhesive layer 124 and/or the cover 126 can be designated as a planar encapsulation structure 128.

FIGS. 2A and 2B show schematic cross-sectional views of an optoelectronic component, in accordance with various embodiments.

The schematic cross-sectional view in FIG. 2A illustrates one embodiment of an optoelectronic component in accordance with one of the configurations from the description of FIG. 1—identified as excerpt 100.

The illustration shows: A first electrode 110 formed on or above a carrier 102. An organic functional layer structure 112 is formed on or above the first electrode 110. A second electrode 114 is formed above or on the organic functional layer structure 112. The second electrode 114 is electrically insulated from the first electrode 110 by an electrical insulation 204. The second electrode 114 can be physically and electrically connected to an electrical connection layer 202. The electrical connection layer 202 can be formed on or above the carrier 102 in the geometrical edge region of the carrier 102, for example laterally alongside the first electrode 110. The electrical connection layer 202 is electrically insulated from the first electrode 110 by a further electrical insulation 204. A barrier thin-film layer 108 is arranged on or above the second electrode 114 in such a way that the second electrode 114, the electrical insulations 204 and the organic functional layer structure 112 are surrounded by the barrier thin-film layer 108, that is to say are enclosed in a combination of the barrier thin-film layer 108 with the carrier 102. The barrier thin-film layer 108 can hermetically seal the enclosed layers with regard to harmful environmental influences. An adhesive layer 124 is arranged on or above the barrier thin-film layer 108 in such a way that the adhesive layer 124 areally and hermetically seals the barrier thin-film layer 108 with regard to harmful environmental influences. A cover 126 is arranged on or above the adhesive layer 124. The cover for example be adhesively bonded, for example be laminated, onto the barrier thin-film layer 108 by an adhesive 124.

Approximately the region of the optoelectronic component 100 with organic functional layer structure 112 on or above the carrier 102 can be designated as an optically active region. Approximately the region of the optoelectronic component 100 without an organic functional layer structure 112 on or above the carrier 102 can be designated as an optically inactive region.

An optoelectronic component 100 embodied as transparent, for example including a transparent carrier 102, transparent electrodes 110, 114 and a transparent barrier thin-film layer 108, may include for example an optically active region having two planar, optically active sides—the top side and the underside of the optoelectronic component 100 in the schematic cross-sectional view.

However, the optically active region of an optoelectronic component 100 can also have only one optically active side and one optically inactive side, for example in the case of an optoelectronic component 100 designed as a top emitter or bottom emitter, for example by the second electrode 100 or the barrier thin-film layer 108 being embodied as reflective for electromagnetic radiation provided.

The carrier 102, the first electrode 110, the organic functional layer structure 112, the second electrode 114, the barrier thin-film layer 108, the adhesive layer 124 and the cover 126 can be designed for example in accordance with one of the configuration from the descriptions of FIG. 1.

The electrical insulations 204 are designed in such a way as to prevent a current flow between two electrically conductive regions, for example between the first electrode 110 and the second electrode 114. The substance or the substance mixture of the electrical insulation can be for example a covering or a coating agent, for example a polymer and/or a lacquer. The lacquer may include for example a coating substance that can be applied in liquid form or in pulverulent form, for example may include or be formed from a polyimide. The electrical insulations 204 can be applied or formed for example by a printing method, for example in a structured fashion. The printing method may include for example inkjet printing, screen printing and/or pad printing.

The electrical connection layer 202 may include or be formed from, as substance or substance mixture, a substance or a substance mixture similar to that of the electrodes 110, 114 in accordance with one of the configurations from the descriptions of FIG. 1.

In the geometrical edge region, the optoelectronic component 200 can be embodied in such a way that contact pads 206, 208 are formed for making electrical contact with the optoelectronic component 200, for example by electrically conductive layers, for example electrical connection layers 202, electrodes 110, 114 or the like, being at least partly exposed in the region of the contact pads (not illustrated).

The schematic cross-sectional view in FIG. 2B illustrates a further embodiment of an optoelectronic component in accordance with one of the configurations from the description of FIG. 1—identified as excerpt 100.

The cross-sectional view illustrates a region of a conventional optoelectronic component, for example similar to a configuration from the description of FIG. 2A, without contact pads 202, i.e. a different sectional plane is illustrated.

Furthermore, the adhesion layer 124 can have a larger or smaller (illustrated) lateral dimension than the cover 126, for example. The different width or depth can have for example a magnitude of upto approximately 2 mm, for example approximately in a range of approximately 100 µm to approximately 500 µm.

Laterally, the planar encapsulation structure 128 composed of barrier thin-film layer 108, adhesive layer 124 and cover 126, can have diffusion channels for example for water—indicated by the arrows 216. As a result, water can diffuse into the electrically active region 106.

FIG. 3 shows a diagram of a method for producing an optoelectronic component, in accordance with various configurations.

The method for producing an electronic component, for example an optoelectronic component in accordance with one of the configuration from the descriptions of FIG. 1 or FIGS. 2A and 2B, may include forming an electrically active region 106 on or above a carrier 102. In other words: an electrically active region 106 on or above a carrier 102 can be provided for the method.

Furthermore, the method may include forming 302 a planar encapsulation structure 128 on or above the electrically active region 106.

In one embodiments, forming 302 the planar encapsulation structure 128 may include for example forming a planar, first encapsulation layer 108, for example a barrier thin-film layer 108, on or above the electrically active region 106. For example a planar adhesion layer 124, for example an adhesive layer 124, can be formed on or above the first encapsulation layer 108. For example further encapsulation layers can be formed or arranged on or above the adhesion layer 124, for example a further barrier thin-film layer on or above the cover 126 (not illustrated). The adhesion layer 124, that is to say the adhesive layer 124, can cohesively connect the cover 126 to the barrier thin-film layer 108. The adhesion layer 124 can act as a diffusion barrier, for example, and reduce the diffusion rate into the barrier thin-film layer 108.

Furthermore, the method may include forming 304 an encapsulation laterally on or above the exposed adhesion layer 128. The encapsulation can be embodied in such a way that the planar encapsulation structure 128 is at least partly surrounded laterally by the encapsulation.

The encapsulation can form an additional barrier effect with respect to the planar encapsulation structure 128 and for example reduce the diffusion rate laterally into the adhesion layer 124.

In one embodiment, the additional barrier effect can be realized by a thin metal layer being applied on the side surfaces of the optoelectronic component, for example the OLED, for example in the geometrical edge region of the optoelectronic component.

The moisture permeability of metal can be lower than that of adhesives, whereby the diffusion of water laterally into the adhesive layer 124 is reduced.

However, the encapsulation can also include or be formed from a different substance or a different substance mixture which reduces the diffusion rate laterally into the planar encapsulation structure, for example a ceramic or metal oxide or the like.

The encapsulation can constitute a diffusion barrier or migration barrier for water, for example water vapor, moisture, humidity, in the diffusion path into the adhesive layer 124 or the barrier thin-film layer 108.

Forming 304 the encapsulation on or above at least one lateral surface of the planar encapsulation structure 128 should be carried out at low temperatures. This makes it possible to ensure that the temperature input into the electrically active region 106, for example into the organic functional layer structure 112, during the process for forming the encapsulation is locally low and does not constitute a harmful environmental influence.

In the context of this description, a low temperature may include for example a temperature value less than the softening temperature of plastics substrates, for example less than approximately 150° C., for example less than the permissible temperature in the automotive sector, for example less than approximately 120° C., for example in a temperature range of approximately 90° C. to approximately 100° C.

Methods for forming the encapsulation may include for example powder coating (low temperature powder coating); a complex plasma or plasma dust, aerosol jet printing, an anhydrous wet-chemical process, for example electrolysis or electroplating in an anhydrous solution; cohesive bonding, for example adhesive bonding, for example by a silver conductive paste, or the like.

The encapsulation may include for example a ceramic, a metal oxide, a sealed plastic, for example by a fluorine derivative, a metal or the like, for example as metal: copper, silver and/or the derivatives and substance mixtures thereof.

Furthermore, the method may include exposing 306 contact pads 202, wherein the exposed contact pads can be designed for making electrical contact with the optoelectronic component, for example can be electrically connected to an electrode of the electrically active region 106 and/or be designed as an electrode of the optoelectronic component.

Figure 4B:
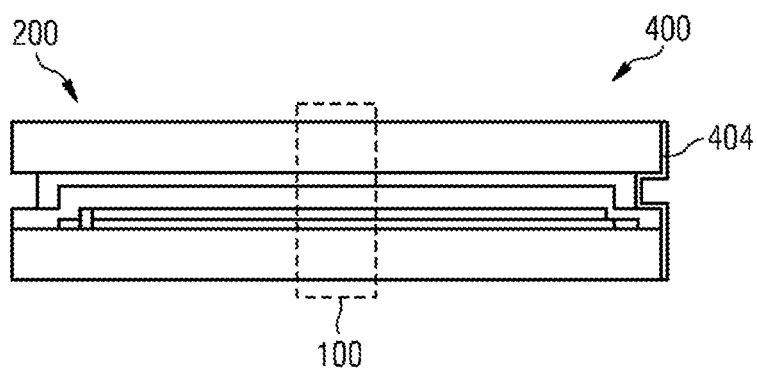

FIGS. 4A and 4B show schematic cross-sectional views of an optoelectronic component in the method for producing an optoelectronic component, in accordance with various configurations.

The illustration shows one embodiment of an optoelectronic component 200 in accordance with one of the configurations from the description of FIG. 1 and FIG. 2B, identified as excerpt 100.

FIG. 4A schematically illustrates one embodiment of forming 304 an encapsulation 404 by a directional, for example focused matter jet 402, for example in accordance with the description of FIG. 3.

The width of the matter jet 402 may include for example a width in a range of approximately 1 mm to approximately 2 mm, i.e. can be for example very much wider than the thickness of the planar encapsulation structure 128 and of the electrically active region 106. As a result, forming 304 the encapsulation can be realized for example by a single coating process.

By a mask, for example a diaphragm (not illustrated), the width of the matter jet 402 can be reduced, for example, or the matter jet 402 can be focused, for example. By a mask, the width can be reduced to a magnitude in a range of approximately 50 µm to approximately 200 µm, for example approximately 100 µm.

FIG. 4B schematically illustrates the optoelectronic component 400 from FIG. 4A after the process of forming 404 the encapsulation. The illustration shows an encapsulation on or above a side surface of the planar encapsulation structure 128.

FIGS. 5A to 5D show schematic cross-sectional views of an optoelectronic component in the method for producing an optoelectronic component, in accordance with various configurations.

Figure 5A:
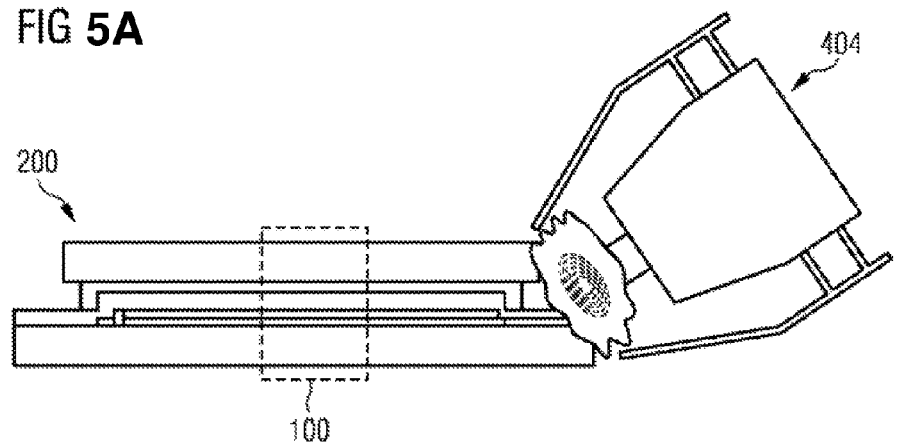
FIGS. 5A to 5D show schematic cross-sectional views of an optoelectronic component in the method for producing an optoelectronic component, in accordance with various configurations.
Figure 5B:
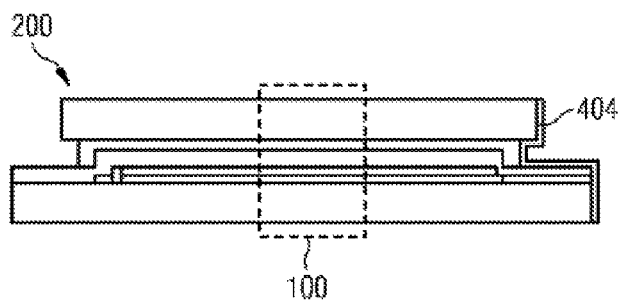

FIG. 5A and FIG. 5B illustrate an optoelectronic component in method 300 for producing an optoelectronic component, in accordance with one of the configurations from the description of FIGS. 4A and 4B. However, the illustration shows a sectional plane of the optoelectronic component in accordance with various configurations with contact pads 202 for making electrical contact.

Figure 5C:
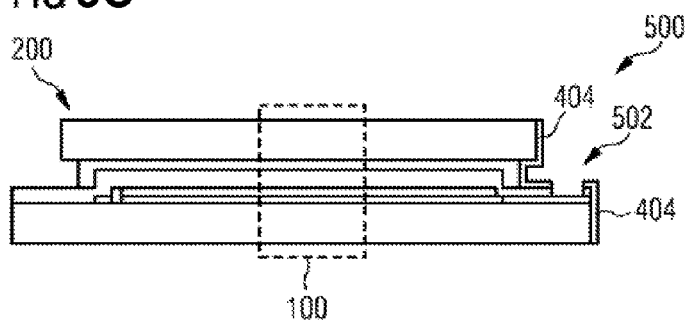

For making electrical contact with a contact pad 202, the contact pad should be exposed during the process of forming 304 the encapsulation 404—illustrated in FIG. 5C as region 502 in the optoelectronic component 500.

In one embodiment, exposing 306 is realized by virtue of the fact that no encapsulation 404 is formed on or above the contact pad 202.

In another embodiment, the encapsulation 404 on or above the contact pad 202 is removed (306), after the process of forming 304 the encapsulation 404, for example the contact pad 202 is exposed.

Exposing 306 the contact pad 202 below the encapsulation 404 can be carried out mechanically or ballistically, for example.

Ballistically exposing the regions to be exposed can be realized for example by the bombardment of the region to be exposed with particles, molecules, atoms, ions, electrons and/or photons.

Bombardment with photons can be embodied for example as laser ablation with a wavelength in a range of approximately 200 nm to approximately 1700 nm, for example can be embodied in a focused manner, for example with a focus diameter in a range of approximately 10 μm to approximately 2000 μm, for example in a pulsed manner, for example with a pulse duration in a range of approximately 100 fs to approximately 0.5 ms, for example with a power of approximately 50 mW to approximately 1000 mW, for example with a power density of approximately 100 kW/cm$^2$ to approximately 10 GW/cm$^2$, and for example with a repetition rate in a range of approximately 100 Hz to approximately 1000 Hz.

Figure 5D:
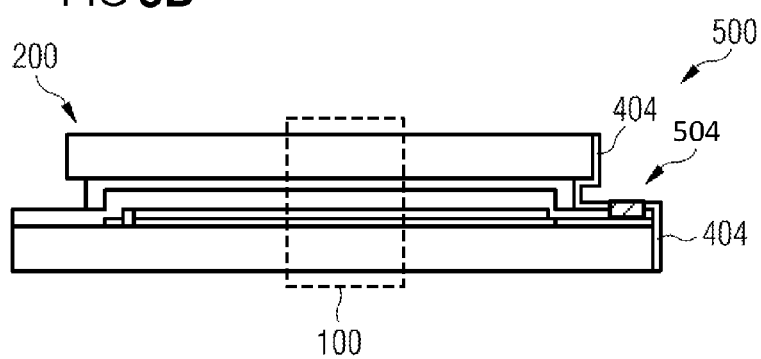

In the removed area of the encapsulation 404 above the contact pad 202, for example in the exposed area of the contact pad 202, at least one electrical feedthrough 504 may be formed in the encapsulation—illustrated in FIG. 5D. That is, the electrical feedthrough 504 is arranged above the contact pad 202. The electrical feedthrough 504 is designed for making electrical contact with the electrically active region.

Figure 6:
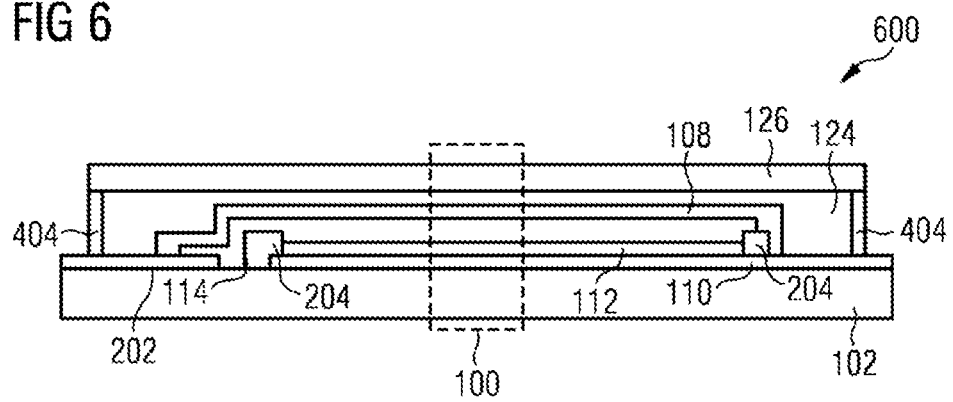
FIG. 6 shows a schematic cross-sectional view of an optoelectronic component, in accordance with various embodiments.

FIG. 6 shows a schematic cross-sectional view of an optoelectronic component, in accordance with various configurations.

FIG. 6 illustrates a schematic cross section of one embodiment of an optoelectronic component 600 in accordance with one of the configurations from the description of FIG. 1—identified as excerpt 100, in which forming 304 the encapsulation is embodied before a cover 126 is applied to or over an adhesive layer 124. In other words: the cover 126 can be applied to or over the adhesion layer 124 after the process of forming 304 an encapsulation.

Figure 7A:
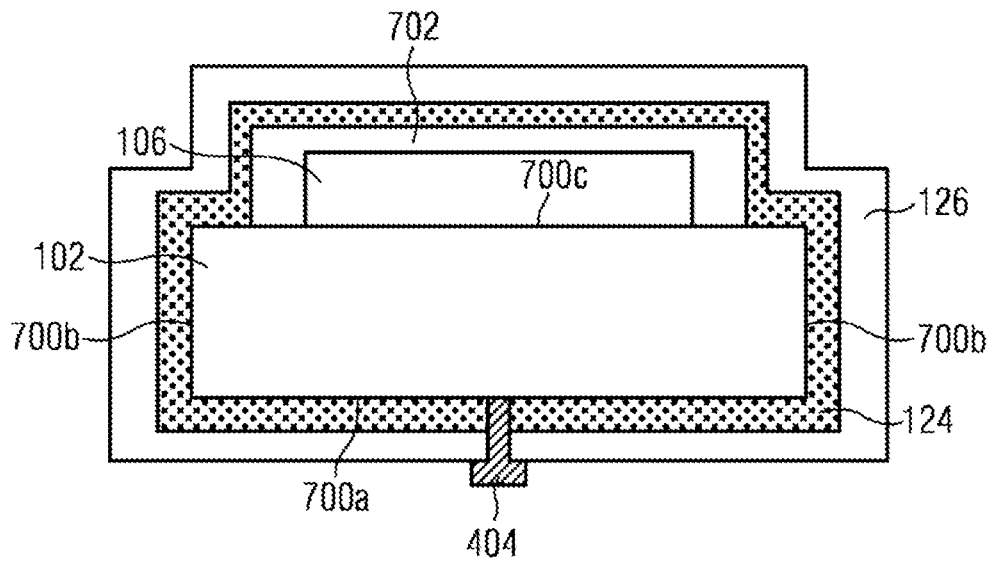
FIGS. 7A and 7B show schematic cross-sectional views of optoelectronic components, in accordance with various configurations.
Figure 7B:
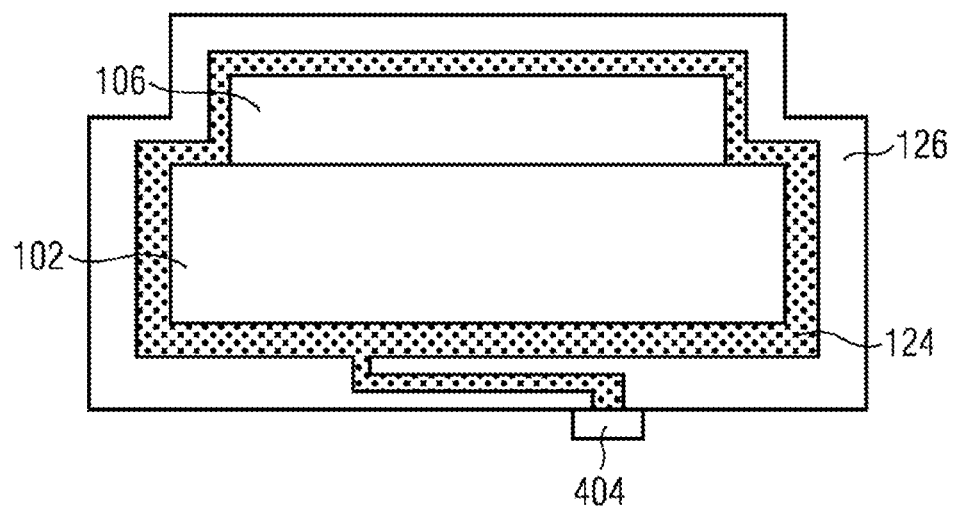

FIGS. 7A and 7B show schematic cross-sectional views of optoelectronic components in accordance with various configurations.

In various embodiments, the cover 126 can be arranged such that it surrounds the electrically active region 106 and the carrier 102 in the region of the upper surface 700c, the at least one side surface 700b and in the region of the lower surface 700a and is connected, for example cohesively, to the carrier 102 at least at the lower surface 700a by the adhesion layer 124.

In other words: the cover 126 can be folded and/or shaped around the carrier 102 and the electrically active region 106 such that the carrier 102 and the electrically active region 106 are completely surrounded by the cover 126, apart from possibly one or a plurality of electrical feedthroughs (not illustrated) and a small part of the lower surface 102a of the carrier 102.

In various embodiments, the cover 126 can be embodied in an integral fashion, for example as a hermetically impermeable barrier film 126.

In various embodiments, the adhesion layer 124 may include an adhesive, for example a physically curing adhesive, for example an adhesive that cures by UV irradiation or heating, a chemically curing adhesive or a pressure sensitive adhesive (PSA).

In various embodiments, the cover 126 in the form of a barrier film can be cohesively connected, by an adhesion layer 124 including pressure sensitive adhesive, to at least the lower surface 700a of the carrier 102, alternatively additionally to the side surfaces 700b of the carrier 102 and/or the upper surface 700c of the carrier 102 and/or the electrically active region 106.

The use of a pressure sensitive adhesive for applying a cover is highly suitable for reshaping, since the cover adheres directly without a curing step, for example UV curing or thermal solidification.

In various embodiments, the adhesion layer 124 can be embodied such that, besides connecting the cover 126 to the carrier 102 or the cover 126 to the carrier 102 and the electrically active region 106, said adhesion layer has further functions, for example absorbing or taking up or trapping penetrated water or oxygen by virtue of the provision of getter particles in the adhesion layer 124, protection against UV radiation or heat conduction.

In various embodiments, the adhesion layer 124 can have a water vapor transmission rate of WVTR<100° g m$^2$ d$^{-1}$.

In various embodiments, owing to the cover 126 placed right into the region of the lower surface 700a, there arise an exposed adhesion layer 124 on the rear side of the optically active region 106, on or above which the encapsulation 404 can be formed.

In various embodiments, the encapsulation 404 can be formed on or above the exposed adhesion layer 124 for example by metal pastes, silver conductive adhesives, in the case of a suitable lower surfaces 700a of the carrier 102, for example a Cu film rear side, also by soldering, electrochemical deposition, or by a subsequent rear-side thin-film encapsulation, for example by chemical or physical vapor deposition.

In various embodiments, the additional encapsulation 404 can be formed on or above the exposed adhesion layer 124 and the adjoining cover 126—illustrated in FIG. 7A.

In various embodiments, the cover 126 on the rear side 700a of the carrier 106 can be at least partly complementarily structured—illustrated in FIG. 7B, which intermesh in the folded state.

To put it another way, the cover 126 can be embodied such that after folding the complementarily structured regions of the cover 126 are located one above another in such a way that despite an overlap the cover 126 is embodied in a planar fashion, for example.

Applying the cover 126 can lead to sensitive layers of the electrically active region 106 being mechanically damaged; by way of example, pressure can press particles into the electrically active region 106 during the process of applying the cover 126 with a pressure sensitive adhesive. In order to avoid or minimize this, sensitive layers can be provided with an anti-scratch protective layer 702 beforehand. Said anti-scratch protective layer can be applied mechanically gently by blade coating or stencil printing, for example.

In various embodiments, the anti-scratch protective layer 702 may include a lacquer or an adhesive.

In various embodiments, the anti-scratch protective layer 702 can be embodied as translucent or transparent.

In various embodiments, the anti-scratch protective layer 702 can moreover be further functional or functionalized, for example optically or chemically.

In various embodiments, the anti-scratch protective layer 702 may include particles or a layer fashioned such that it increases the proportion of scattered light.

In various embodiments, the anti-scratch protective layer 702 may include lenses formed by a so-called imprint method, for example.

In various embodiments, the anti-scratch protective layer 702 can be configured such that it serves as a filter for one or a plurality of wavelengths or wavelength ranges, for example for wavelengths in the UV spectral range for example between 100 nm and 380 nm, or in the range of visible light.

In various embodiments, the anti-scratch protective layer 702 may include getter particles suitable for taking up penetrated water or oxygen, for example.

The cover 126, the adhesion layer 124, the carrier 102, the electrically active region 106 and the encapsulation 404 can be embodied in accordance with one of the configurations from the description of FIGS. 1, 2A, 2B, 3, 4A and 4B, 5A to 5D and FIG. 6.

In various embodiments, an optoelectronic component and a method for producing an optoelectronic component are provided which make it possible the diffusion of moisture into an optoelectronic component, for example an organic optoelectronic component, for example an OLED component.

By the seal additionally applied to the optoelectronic component laterally, it is possible to realize an additionally highly effective moisture barrier and thus to achieve a lengthened storage time for the component.

On account of the small height of the additional moisture barrier, it can be applied to existing component geometries, without altering the latter.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
  a carrier;
  a planar, electrically active region on or above the carrier;
  a contact pad designed for making electrical contact with the electrically active region;
  an adhesion layer on or above the electrically active region, wherein the adhesion layer at least partly surrounds the electrically active region;
  a cover on or above the adhesion layer, wherein a part of the adhesion layer is exposed; and
  an encapsulation on or above the exposed adhesion layer;
  wherein the encapsulation is formed from an inorganic substance or substance mixture;
  wherein the encapsulation comprises at least one electrical feedthrough,
  wherein the electrical feedthrough is designed for making electrical contact with the electrically active region; and
  wherein the electrical feedthrough is arranged above the contact pad.

2. The optoelectronic component as claimed in claim 1, wherein a barrier thin-film layer is formed between the adhesion layer and the electrically active region.

3. The optoelectronic component as claimed in claim 1, wherein the adhesion layer comprises or is formed from an adhesive.

4. The optoelectronic component as claimed in claim 1, wherein the exposed adhesion layer at least partly laterally surrounds the electrically active region.

5. The optoelectronic component as claimed in claim 1, wherein the cover, the carrier and the encapsulation are embodied in such a way that the electrically active region is hermetically impermeable with regard to at least water and/or oxygen.

6. The optoelectronic component as claimed in claim 5, wherein the encapsulation is designed similarly or identically to the barrier thin-film layer.

7. The optoelectronic component as claimed in claim 1, wherein the encapsulation is embodied in such a way that the permeability of the encapsulation is less than the lateral permeability of the adhesion layer with regard to the diffusion of water and/or oxygen.

8. The optoelectronic component as claimed in claim 1, wherein the electrically active region comprises at least one organic functional layer system, a first electrode and at least one second electrode, wherein the organic functional layer system is formed between the first electrode and the second electrode, and wherein the electrodes are designed for making electrical contact with the organic functional layer system.

9. The optoelectronic component as claimed in claim 1, wherein the optoelectronic component is designed as an organic, optoelectronic component.

10. A method for producing an optoelectronic component, the method comprising in this order:
  providing a planar, electrically active region on or above a carrier; providing a contact pad designed for making electrical contact with the electrically active region
  forming an adhesion layer on or above the electrically active region, wherein the adhesion layer at least partly surrounds the electrically active region;
  forming a cover on or above the adhesion layer, wherein a part of the adhesion layer is exposed; and
  forming an encapsulation on or above the exposed adhesion layer, wherein the encapsulation is formed from an inorganic substance or substance mixture;
  wherein the forming of the encapsulation comprises at least one of the following methods: a powder coating; a complex plasma or plasma dust, an aerosol jet printing;
  wherein the encapsulation is formed comprising at least one electrical feedthrough, wherein the electrical feedthrough is designed for making electrical contact with the electrically active region; and
  wherein the electrical feedthrough is arranged above the contact pad.

11. The method as claimed in claim 10,
further comprising:
  forming a barrier thin-film layer on or above the electrically active region.

12. The method as claimed in claim 10,
wherein the adhesion layer comprises or is formed from an adhesive.

13. The method as claimed in claim 10,
wherein the cover, the carrier and the encapsulation are designed or embodied in such a way that the electrically active region is laterally hermetically sealed with regard to at least water and/or oxygen.

14. The method as claimed in claim 10,
further comprising: forming a barrier thin-film layer on or above the electrically active region,
wherein the adhesion layer is formed in such a way that the barrier thin-film layer is sealed with regard to at least water and/or oxygen.

15. The method as claimed in claim 10,
wherein the electrically active region comprises at least one organic functional layer system, at least one first electrode and at least one second electrode, wherein the organic functional layer system is formed between the first electrode and the second electrode, and wherein the electrodes are designed for making electrical contact with the organic functional layer system.

16. The method as claimed in claim 10,
wherein the optoelectronic component is embodied as an organic, optoelectronic component.

17. The optoelectronic component as claimed in claim 1,
wherein the optoelectronic component is designed as an organic solar cell or an organic light emitting diode.

18. The method as claimed in claim 10,
wherein the optoelectronic component is embodied as an organic solar cell or an organic light emitting diode.

\* \* \* \* \*

UNITED STATES PATENT AND TRADEMARK OFFICE
CERTIFICATE OF CORRECTION

PATENT NO. : 9,716,247 B2
APPLICATION NO. : 14/430954
DATED : July 25, 2017
INVENTOR(S) : Simon Schicktanz et al.

It is certified that error appears in the above-identified patent and that said Letters Patent is hereby corrected as shown below:

On the Title Page

The applicant "OSRAM OPTO Semiconductors GmbH" should be replaced with --OSRAM OLED GmbH--

In the Specification

Column 30, Line 36: Please delete "WVTR<100° g m$^2$ d$^{-1}$" and insert as follows:
--WVTR < 10° g m$^{-2}$ d$^{-1}$--

Signed and Sealed this
Second Day of January, 2018

Joseph Matal
*Performing the Functions and Duties of the*
*Under Secretary of Commerce for Intellectual Property and*
*Director of the United States Patent and Trademark Office*